United States Patent
Chiyo et al.

(10) Patent No.: US 6,593,016 B1
(45) Date of Patent: Jul. 15, 2003

(54) GROUP III NITRIDE COMPOUND SEMICONDUCTOR DEVICE AND PRODUCING METHOD THEREOF

(75) Inventors: Toshiaki Chiyo, Ama-gun (JP); Naoki Shibata, Bisai (JP); Masanobu Senda, Niwa-gun (JP); Jun Ito, Inazawa (JP); Shizuyo Asami, Inazawa (JP); Shinya Asami, Inazawa (JP); Hiroshi Watanabe, Ichinomiya (JP)

(73) Assignee: Toyoda Gosei Co., Ltd., Aichi (JP)

( * ) Notice: Subject to any disclaimer, the term of this patent is extended or adjusted under 35 U.S.C. 154(b) by 194 days.

(21) Appl. No.: 09/606,081

(22) Filed: Jun. 29, 2000

(30) Foreign Application Priority Data

Jun. 30, 1999 (JP) .......................... 11-222882
Nov. 5, 1999 (JP) .......................... 11-315193

(51) Int. Cl.$^7$ .............................. H01L 29/00; B32B 9/00
(52) U.S. Cl. ................... 428/698; 428/336; 428/699; 428/700; 428/702; 257/79
(58) Field of Search ................ 428/698, 702, 428/704, 212, 699, 700, 336; 257/79

(56) References Cited

U.S. PATENT DOCUMENTS

| | | | |
|---|---|---|---|
| 5,122,845 A | | 6/1992 | Manabe et al. |
| 5,218,216 A | | 6/1993 | Manabe et al. ............. 257/103 |
| 5,571,603 A | * | 11/1996 | Utumi et al. ................ 428/212 |
| 5,741,724 A | | 4/1998 | Ramdani et al. ............ 437/128 |
| 5,909,040 A | | 6/1999 | Ohba et al. .................. 257/190 |
| 5,936,329 A | * | 8/1999 | Shibata et al. .............. 310/360 |
| 5,990,495 A | | 11/1999 | Ohba ........................... 257/94 |

FOREIGN PATENT DOCUMENTS

| | | |
|---|---|---|
| JP | 59-57997 | 4/1984 |
| JP | 59057997 | 4/1984 |
| JP | 62-119196 | 5/1987 |
| JP | 2-229476 | 9/1990 |
| JP | 5-41541 | 2/1993 |
| JP | 05041541 | 2/1993 |
| JP | 7235692 | 9/1995 |
| JP | 7-321374 | 12/1995 |
| JP | 9-64477 | 3/1997 |
| JP | 09064477 | 3/1997 |
| JP | 9-148626 | 6/1997 |

OTHER PUBLICATIONS

O. Briot et al.; "Optimizaiton . . . of GaN on sapphire"; Materials Science Engineering, B43, pp. 147–153; 1997 (No month).

R. Uchida et al.; "Characterization . . . of GaN"; Solid–Solid State Electronics, vol. 41, No. 2, pp. 135–139; 1997 (No month).

D. Byun et al.; "Reactive . . . GaN growth"; Thin Solid Films 326, pp. 151–153; 1998 (No month).

T. Kachi et al; "A new . . . phase epitaxy"; XP–000742752, vol. 72 No. 6, 1998 No month.

\* cited by examiner

*Primary Examiner*—Deborah Jones
*Assistant Examiner*—Stephen Stein
(74) *Attorney, Agent, or Firm*—McGinn & Gibb, PLLC

(57) ABSTRACT

A group III nitride compound semiconductor device has a substrate and an AlN single crystal layer formed on the substrate. The AlN single crystal layer has a thickness of from 0.5 to 3 μm and has a substantially flat surface. The half-value width of an X-ray rocking curve of the AlN single crystal layer is not longer than 50 sec. In another device, a group III nitride compound semiconductor layer having a thickness of from 0.01 to 3.2 μm is grown at a temperature of from 1000 to 1180° C. on a sapphire substrate having a surface nitride layer having a thickness of not larger than 300 Å.

6 Claims, 9 Drawing Sheets

0.8μm 1.0μm 1.5μm 2.3μm 3.0μm 3.3μm 0.015μm 0.30μm 0.45μm 0.90μm 1.9μm 2.3μm

1050°C

1110°C

1130°C

1150°C

1170°C

1200°C

GROUP III NITRIDE COMPOUND SEMICONDUCTOR DEVICE AND PRODUCING METHOD THEREOF

BACKGROUND OF THE INVENTION

1. Field of the Invention

The present invention relates to a a group III nitride compound semiconductor device and a producing method therefor. Particularly, it relates to improvement in a buffer layer-forming method used when a group III nitride compound semiconductor device is produced by a metal organic chemical vapor deposition method (MOCVD method).

The present application is based on Japanese Patent Applications No. Hei. 11-222882 and 11-315193, which are incorporated herein by reference.

2. Description of the Related Art

Heretofore known is a group III nitride compound semiconductor device having a structure in which group III nitride compound semiconductors are laminated on a sapphire substrate through a buffer layer of $Al_xGa_{1-x}N$ ($0 \leq X \leq 1$).

For example, Unexamined Japanese Patent Publication No. Sho. 62-119196 has described a buffer layer-forming method in which a buffer layer of $Al_xGa_{1-x}N$ ($0 \leq X \leq 1$) is grown at a growth temperature of from 950 to 1150° C. on a sapphire substrate heated to about 1000° C. by the MOCVD method.

On the other hand, by the investigation thereafter, it has been found that the crystallinity of a GaN compound semiconductor layer grown on a buffer layer is improved when the buffer layer is grown at a lower temperature of about 400° C. on a sapphire substrate heated to about 1000° C. See Unexamined Japanese Patent Publication No. Hei. 2-229476, etc. Any main group III nitride compound semiconductor light-emitting device (LED, etc.) currently put into practical use uses such a low-temperature grown buffer layer.

Incidentally, the growth temperature means the temperature of a substrate heated in execution of an MOCVD method.

The film-forming temperature of a semiconductor layer formed on a buffer layer is, however, generally about 1000° C. Hence, when the aforementioned low-temperature grown buffer layer is used, it is necessary that the substrate heated to about 1000° C. is once cooled to about 400° C. for the sake of surface cleaning and then heated to about 1000° C. again. When the substrate temperature condition is changed in a sequence of high temperature low temperature high temperature in the aforementioned manner, it requires much time and labor to adjust the substrate temperature itself. Hence, the large change of the substrate temperature condition was a barrier against the improvement of efficiency in production of a semiconductor device in which a GaN compound semiconductor layer is grown through such a low-temperature grown buffer layer.

In order to solve the problem, a technique to form a buffer layer at a high temperature has been disclosed in Unexamined Japanese Patent Publications Nos. Hei.9-148626, 7-321374, 9-64477, and Sho. 59-57997, etc.

Further, with respect to nitriding of a surface of a sapphire substrate, see Unexamined Japanese Patent Publication No. Hei. 5-41541.

By the way, a general device structure of a group III nitride compound semiconductor device used for a light-emitting diode, or the like, is formed as follows. A thin buffer layer of AlN or GaN is formed on a sapphire substrate at a low temperature, and a group III nitride compound semiconductor layer, such as a GaN layer, constituting a device function is laminated on the buffer layer. In such a device, the buffer layer is guessed to be amorphous or polycrystalline. It is conceived that the buffer layer serves as a one-directionally oriented seed crystal at a high growth temperature (about 1000° C.) for the formation of a device function layer and relaxes thermal distortion based on the difference in thermal expansivity between the device function layer and the sapphire substrate.

In opposition to such an amorphous or polycrystalline buffer layer, Unexamined Japanese Patent Publication No. Hei. 9-64477 has made a proposal that a single crystalline AlN buffer layer is formed on a sapphire substrate.

Unexamined Japanese Patent Publication No. Hei. 9-64477 has asserted that a single crystalline AlN layer good in crystallinity can be grown on the sapphire substrate when a condition is satisfied so that the buffer layer is grown up to a thickness of from 20 to 300 nm at a high temperature not lower than 1300° C. and that the half-value width of an X-ray rocking curve of the buffer layer is set to be not longer than 90 sec.

AlN as a single crystal with good crystallinity can be surely grown on the sapphire substrate by the background-art method described in Unexamined Japanese Patent Publication No. Hei. 9-64477. If the crystallinity of the buffer layer is good, a device function layer of group III nitride compound semiconductors can be grown with good crystallinity on the buffer layer.

According to the present inventors' examination, however, the crystallinity of the buffer layer formed by the method described in Unexamined Japanese Patent Publication No. Hei. 9-64477 is insufficient to form such a device.

SUMMARY OF THE INVENTION

An object of the present invention is to provide an AlN single crystal layer excellent as a buffer layer for a device function layer of group III nitride compound semiconductors to thereby solve the aforementioned problem.

Another object of the present invention is to form a single crystal AlN layer good in crystallinity on a substrate directly. Such a single crystal AlN layer has both high electrical insulation characteristic and high thermal conduction characteristic. At the same time, the single crystal AlN layer can be used for forming various types of semiconductor functional devices such as a high-frequency conversion device which is an acoustic device utilizing piezoelectric characteristic.

Still another object of the present invention is to provide a preferred condition for formation of a group III nitride compound semiconductor layer on a high-temperature buffer layer as proposed in the background art.

The present inventors have made investigation to achieve the foregoing object. As a result, it has been found that a group III nitride compound semiconductor layer having a crystallinity equal to or better than that of the background-art layer can be grown directly on a sapphire substrate even at an ordinary temperature, that is, at a high temperature for growing a group III nitride compound semiconductor layer when the thickness of the layer is set to be a predetermined value under a predetermined condition.

The present invention is devised on the basis of such knowledge. That is, there is provided a method for producing a group III nitride compound semiconductor device, comprising the step of growing, at a growth temperature of from 1000 to 1180° C., a layer of a group III nitride compound semiconductor having a thickness of from 0.01 to 3.2 μm on a substrate having a surface nitride layer having a thickness of not larger than 300 Å.

In the producing method according to the present invention, a series of production steps of from the step of heating a substrate to the step of forming a group III nitride compound semiconductor layer can be performed without any large temperature change. As a result, the time and labor required for adjusting the substrate temperature in the background art can be reduced, so that the efficiency in production of the semiconductor device can be improved.

Further, according to the inventors' observation, a second group III nitride compound semiconductor layer grown on a first group III nitride compound semiconductor layer formed in the aforementioned condition is excellent in morphology. Hence, the first group III nitride compound semiconductor layer is excellent as a buffer layer interposed between the second group III nitride compound semiconductor layer constituting a device function portion and the substrate.

Still further, the present invention is devised to achieve at least one of the aforementioned objects. According to the present invention, there is provided a group III nitride compound semiconductor device comprising a substrate, and an AlN single crystal layer formed on said substrate, the AlN single crystal layer having a thickness of from 0.5 to 3 μm and having a substantially flat surface, wherein the half-value width of an X-ray rocking curve of the AlN single crystal layer is not longer than 50 sec.

According to the group III nitride compound semiconductor device configured as described above, the crystallinity of the AlN single crystal layer formed on the substrate becomes very good. Hence, a device function can be built in the AlN single crystal layer itself. Moreover, also in the case where a device function layer of group III nitride compound semiconductors is formed on the AlN single crystal layer, the crystallinity of the device function layer becomes equal to or higher than the crystallinity of a device function layer formed on a low-temperature growth buffer layer used generally.

In the above description, the substrate is not specifically limited so long as an AlN single crystal can be grown on the substrate. Examples of the substrate material may include sapphire, materials with spinel structure, silicon, silicon carbide, zinc oxide, gallium phosphide, gallium arsenide, magnesium oxide, manganese oxide, group III nitride compound semiconductor single crystal, etc.

According to the inventors' examination, it is preferable that sapphire, especially the face a thereof, is used as the substrate material.

The thickness of the AlN single crystal layer is set to be in a range of from 0.5 to 3 μm. If the thickness is smaller than 0.5 μm, it is insufficient to form a device function. Contrariwise, the thickness need not be set to be larger than 3 μm.

This is because each of layers necessary for forming a semiconductor device is generally not thicker than 3 μm though the layers may be thicker than 3 μm in total. The reason why the AlN single crystal layer is thicker than that described in Unexamined Japanese Patent Publication No. Hei. 9-64477 is that the crystallinity of AlN itself appears. If the layer is too thin, the crystal is warped because of the influence of the substrate. Contrariwise, when the layer is thickened, the crystal's own nature can be utilized.

The half-value width of an X-ray rocking curve as an indicator for the crystallinity of the AlN single crystal is set to be not longer than 50 sec. If the half-value width is longer than 50 sec, crystallinity sufficiently adapted to a semiconductor device cannot be secured. Also when a group III nitride compound semiconductor layer is grown on the AlN single crystal layer, the half-value width of the AlN single crystal layer is preferably set to be not longer than 50 sec from the point of view of flattening a surface of the AlN single crystal layer substantially to secure the stable crystal growth of the group III nitride compound semiconductor layer.

Group III nitride compound semiconductors formed on the AlN single crystal layer are represented by the general formula $Al_xGa_yIn_{1-x-y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0 \leq X \leq 1$ each). The group III elements may be partially replaced by boron (B), thallium (Tl), etc. The nitrogen (N) may be partially replaced by phosphorus (P), arsenic (As), antimony (Sb), bismuth (Bi), etc.

The group III nitride compound semiconductors may contain any optional dopant. Si, Ge, Se, Te, C, etc. may be used as n-type impurities. Mg, Zn, Be, Ca, Sr, Ba, etc. may be used as p-type impurities. After doped with p-type impurities, the group III nitride compound semiconductor may be subjected to electron beam irradiation, plasma irradiation or heating by a furnace.

The method of forming the group III nitride compound semiconductor layer is not specifically limited but the layer may be formed by a metal organic chemical vapor deposition method (MOCVD method) or by a known method such as a molecular beam epitaxy method (MBE method), a halide vapor phase epitaxy method (HVPE method), a sputtering method, an ion-plating method, an electron shower method, or the like.

Examples of the device constituted by the group III nitride compound semiconductor layer include optical devices such as a light-emitting diode, a photodetector, a laser diode, a solar cell, etc., bipolar devices such as a rectifier, a thyristor, a transistor, etc., unipolar devices such as an FET, etc., and electronic devices such as a microwave device, etc. The present invention may be applied also to laminates as intermediates of these devices. Incidentally, a homostructure, a heterostructure or a double heterostructure having an MIS junction, a pin junction or a p-n junction may be used as the configuration of the light-emitting device. A quantum well structure (single quantum well structure or multiple quantum well structure) may be used as the configuration of the light-emitting layer.

Any of the aforementioned devices may be built in the AlN single crystal layer.

Features and advantages of the invention will be evident from the following detailed description of the preferred embodiments described in conjunction with the attached drawings.

BRIEF DESCRIPTION OF THE DRAWINGS

The file of this patent contains at least one drawing executed in color. Copies of this patent with color drawings will be provided by the Patent and Trademark Office upon request and payment of the necessary fee.

In the accompanying drawings.

DETAILED DESCRIPTION OF THE PREFERRED EMBODIMENTS

The method of forming the AlN single crystal layer will be described below with reference to the drawings. Also the AlN single crystal layer can be formed by the same method as the aforementioned method of forming the group III nitride compound semiconductor layer.

Description will be made hereunder mainly about the MOCVD method.

A sapphire substrate is set in a general MOCVD apparatus so that its face a cleaned by a cleaning and heating process using organic solvent is located as a principal face. In the condition that the substrate temperature is set to be in a range of from 1000 to 1200° C., preferably in a range of from 1050 to 1150° C., $7 \times 10^{-5}$ to $4 \times 10^{-4}$ μmol/cm³ of trimethylaluminum (TMA) as an aluminum source gas and 0.02 to 0.08 μmol/cm³ of ammonia as a nitrogen material gas are almost simultaneously introduced into a reaction vessel. It is preferable from the point of view of temperature controllability that the temperature of the gases is equalized to the substrate temperature when a device function layer of group III nitride compound semiconductors is formed. Hydrogen is used as a carrier gas. The inside pressure of the reaction chamber is set to be, for example, in a range of from $4.0 \times 10^3$ to $1.3 \times 10^4$ Pa (from 30 to 100 Torr), preferably in a range of from $6.7 \times 10^3$ to $1.2 \times 10^4$ Pa (50 to 90 Torr). The flow rate of the carrier gas is set to be, for example, in a range of from 2 to 4 m/sec, preferably in a range of from 2.5 to 3.5 m/sec. The concentration of each of the material gases is adjusted so that the probability of collision on the substrate surface becomes highest with respect to the aforementioned gas flow rate. For example, TMA and ammonia are set to be $1 \times 10^{-4}$ μmol/cm³ and 0.05 μmol/cm³ respectively. Incidentally, it is preferable that the concentration of ammonia is set to be low enough to avoid nitriding of the substrate in the early stage of growth.

Figure 1:
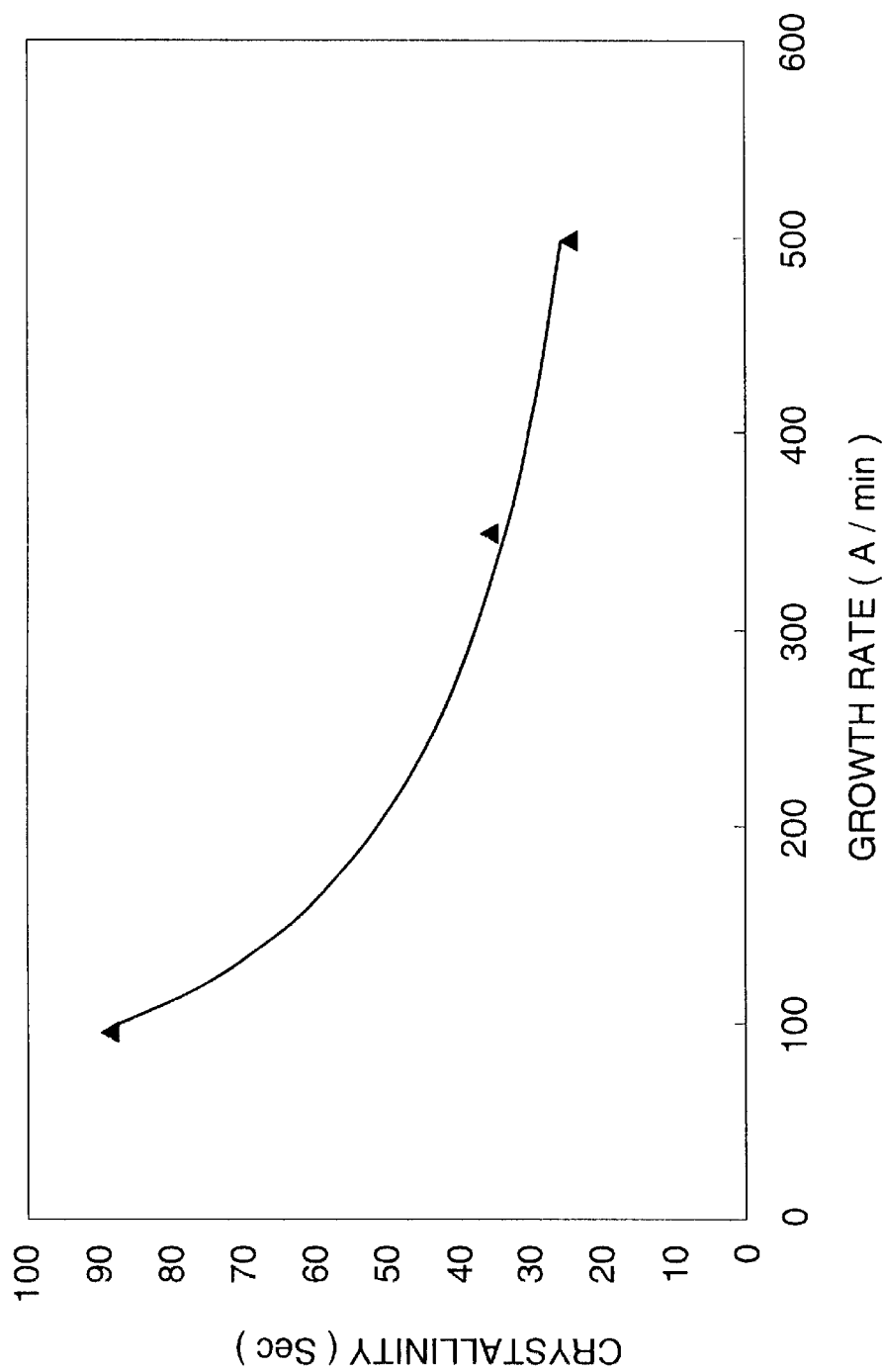
FIG. 1 is a graph showing the relation between the growth rate of an AlN single crystal layer and the crystallinity thereof.

FIG. 1 shows the relation between growth rate (0.1 nm (1 Å)/min) and crystallinity (half-value width of rocking curve: sec) in the case where an AlN single crystal layer 0.5 μm thick is formed on the face a of the sapphire substrate by the aforementioned method. Viewing FIG. 1 along the guideline that the half-value width is set to be not longer than 50 sec, the growth rate is preferably set to be not lower than 20 nm (200 Å)/min. The upper limit of the growth rate is not specifically restricted but, for example, the growth rate is preferably set to be not higher than 60 nm (600 Å)/min. If the growth rate is higher than 60 nm (600 Å)/min, the resulting film is hardly flattened.

More preferably, the growth rate is from 30 to 50 nm (300 to 500 Å)/min.

Figure 2:
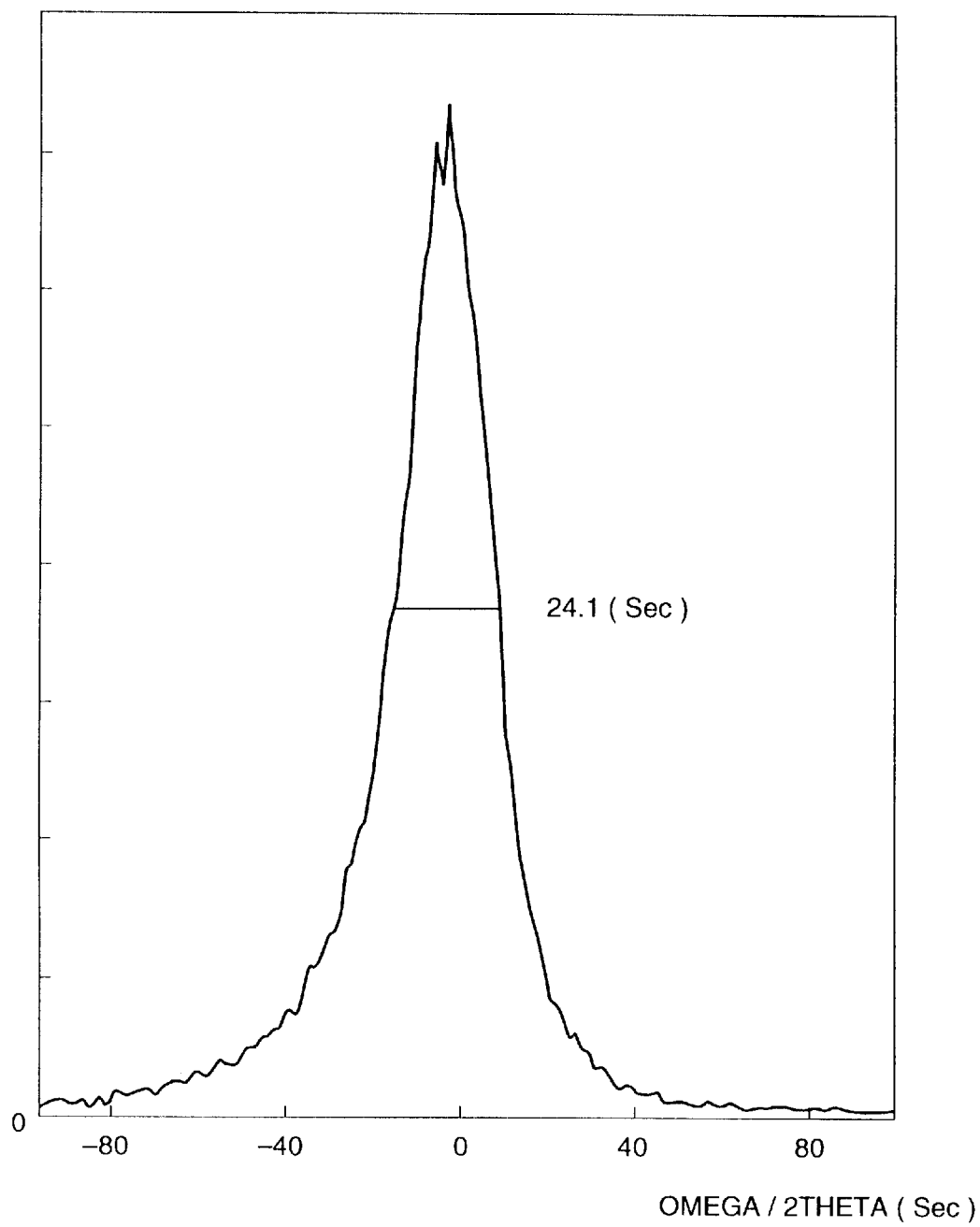
FIG. 2 shows an X-ray rocking curve in the case where the growth rate in FIG. 1 is 50 nm (500 Å)/min.

FIG. 2 shows a rocking curve at the growth rate of 50 nm (500 Å)/min in which the smallest half-value width is exhibited in FIG. 1.

Figure 3:
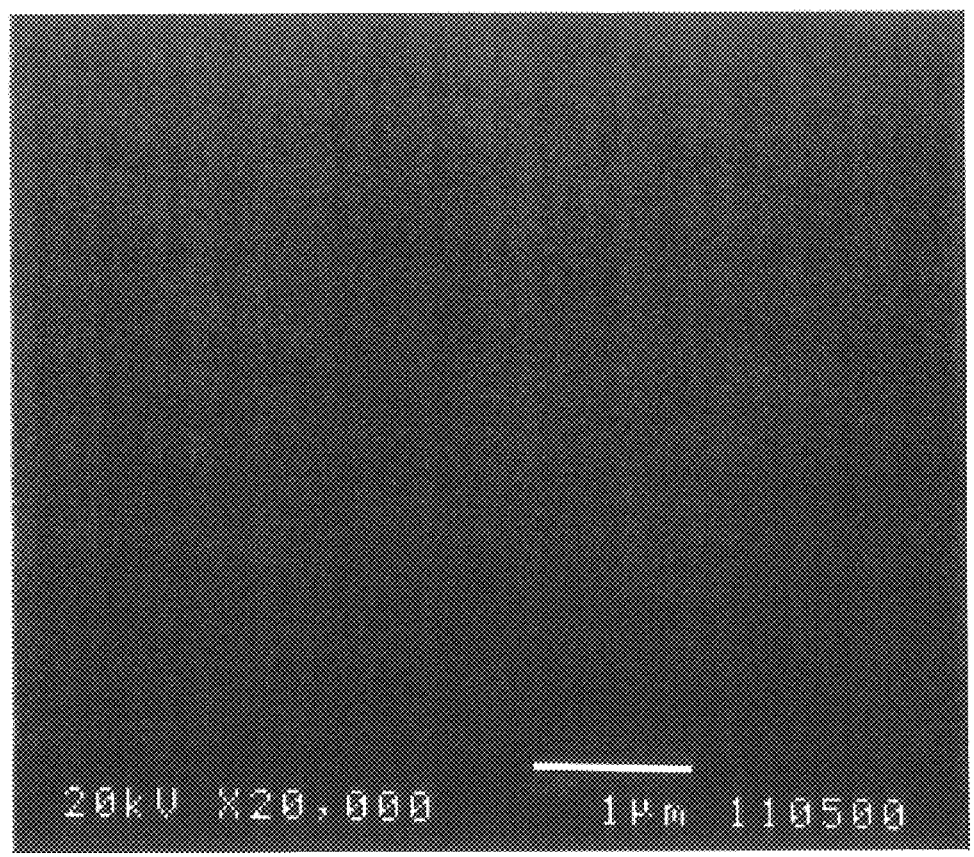
FIG. 3 is a surface electron microscope photograph of the AlN single crystal layer likewise at the growth rate of 50 nm (500 Å)/min.

FIG. 3 shows a surface electron microscope photograph of the AlN single crystal layer on this occasion. As shown in FIG. 3, the surface of the AlN single crystal layer is substantially flat.

Figure 4:
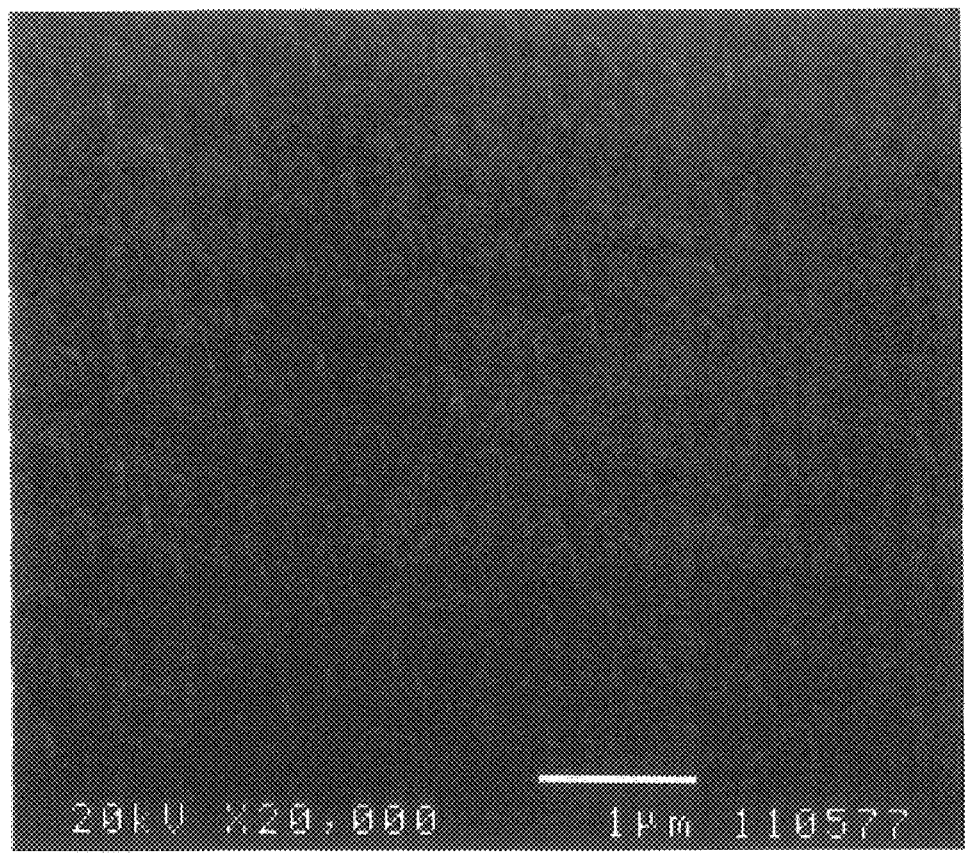
FIG. 4 is a surface electron microscope photograph of the AlN single crystal layer likewise at the growth rate of 10 nm (100 Å)/min.

On the other hand, FIG. 4 shows a surface electron microscope photograph of the AlN single crystal layer in the case where the growth rate is set to be 10 nm (100 Å)/min. As shown in FIG. 4, the surface is not flattened when the half-value width is about 90 sec (the value in the background art). In such a surface structure, there is a possibility that doping may be unable to come up to the purpose also in the case where a device function is built in the AlN single crystal layer. Moreover, also when another device function layer constituted by a group III nitride compound semiconductor layer is to be grown on the AlN single crystal layer, the device function layer is hardly grown with good crystallinity.

An embodiment of the present invention will be described below.

Figure 5:
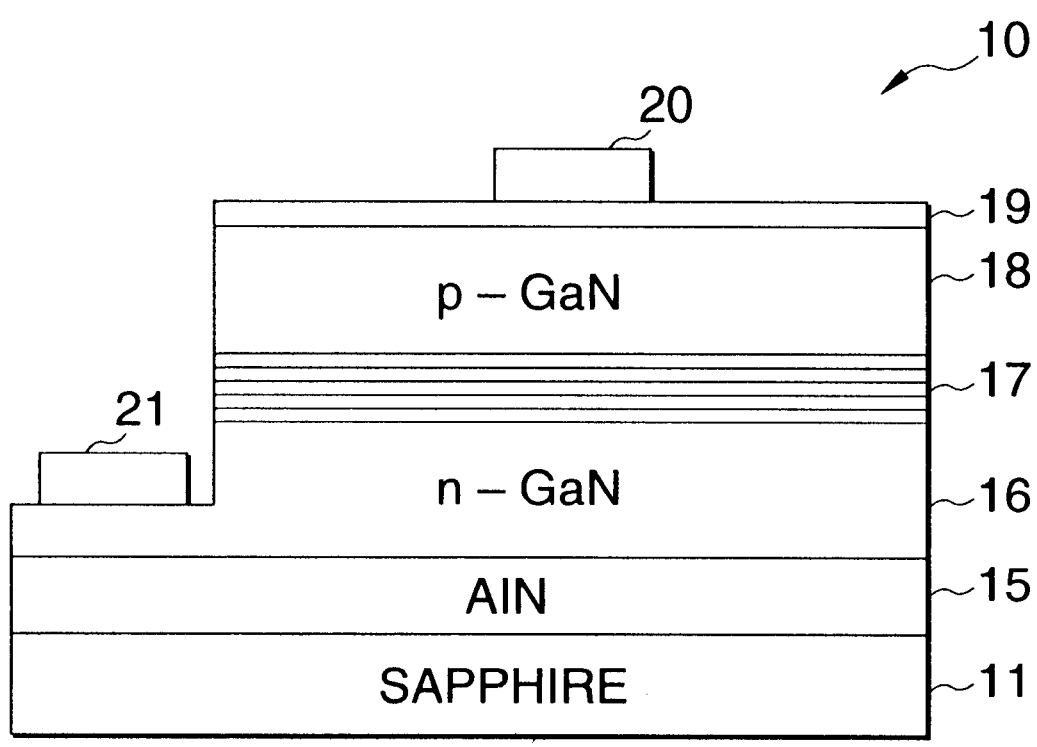
FIG. 5 shows a light-emitting diode as an embodiment of the present invention.
Figure 6A:
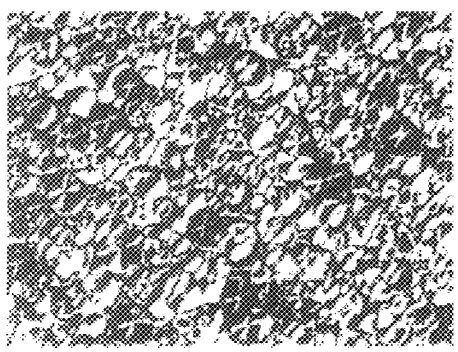
FIGS. 6A to 6F show photographs of the surfaces of each sample in table 2.
Figure 6B:
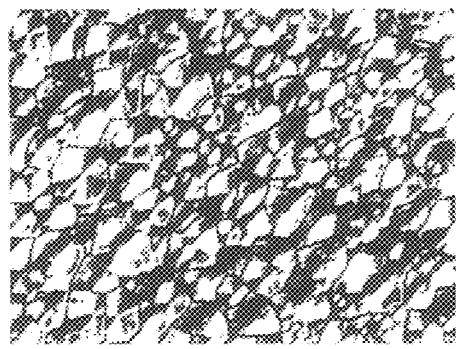
Figure 6C:
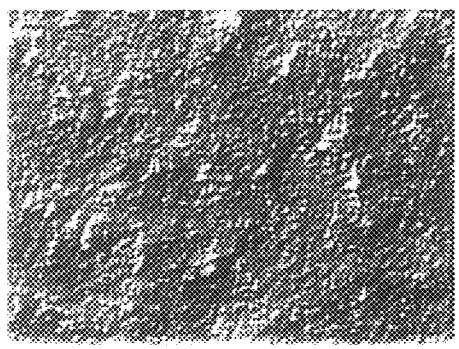
Figure 6D:
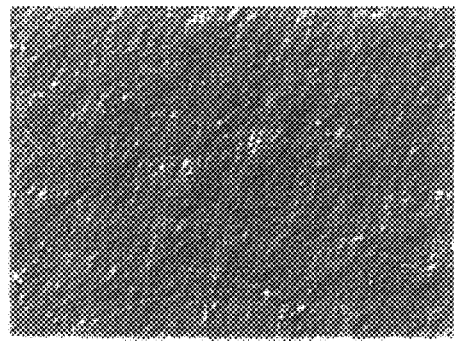
Figure 6E:
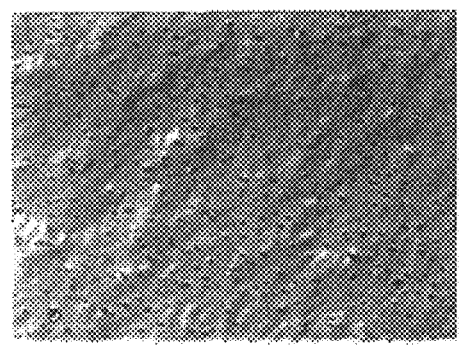
Figure 6F:
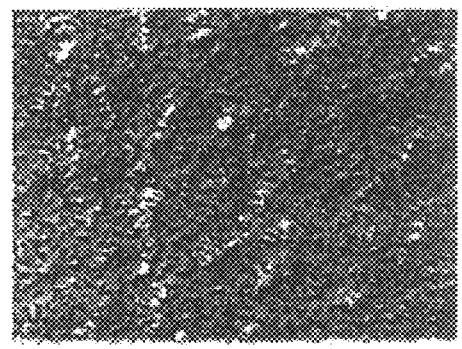
Figure 7A:
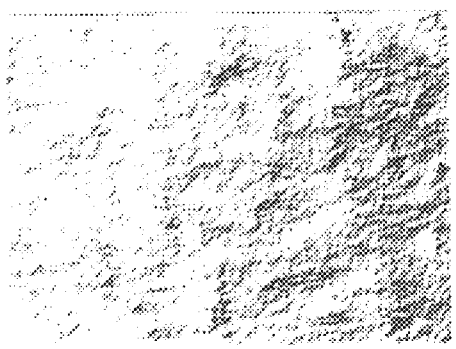
FIGS. 7A to 7F show photographs of the surfaces of each sample in table 4.
Figure 7B:
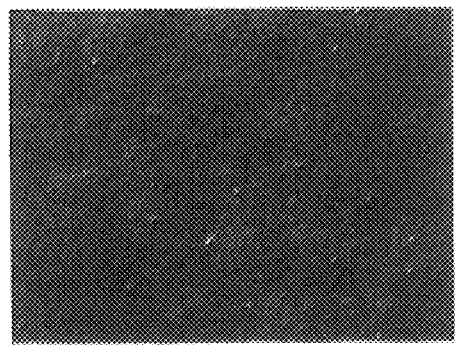
Figure 7C:
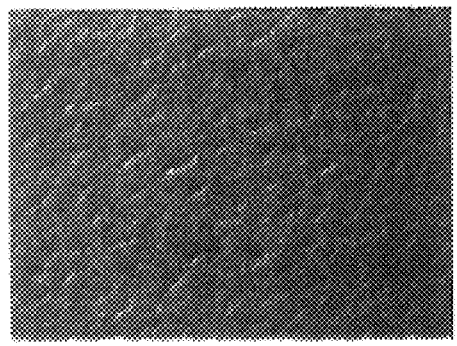
Figure 7D:
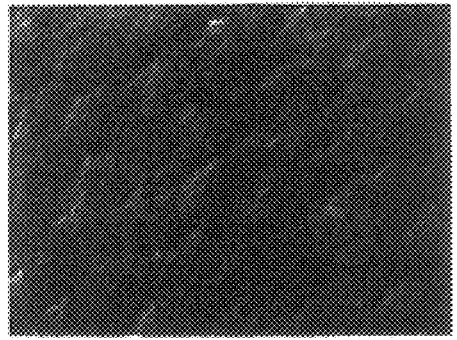
Figure 7E:
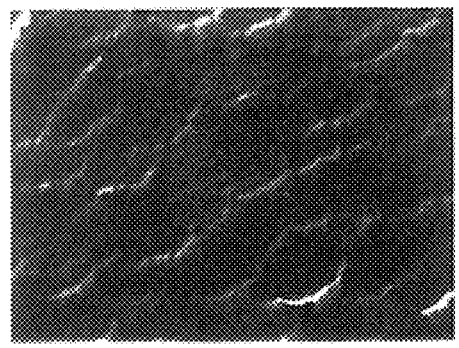
Figure 7F:
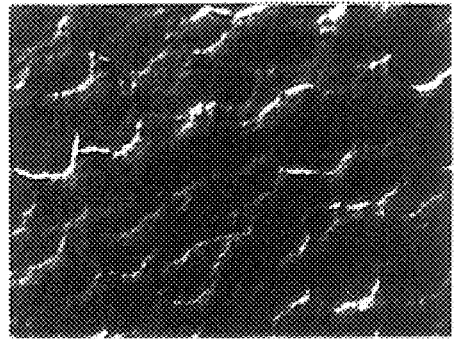

A light-emitting diode 10 is used as this embodiment. The configuration of the light-emitting diode 10 is shown in FIG. 5.

| Layer | Composition | Dopant | (Thickness) |
|---|---|---|---|
| light-transmissible electrode 19 | | | |
| p-type clad layer 18 | p-GaN | Mg | (0.3 μm) |
| light-emitting layer 17 | Superlattice structure | | |
| quantum well layer | $In_{0.15}Ga_{0.85}N$ | | (3.5 nm) |
| barrier layer | GaN | | (3.5 nm) |
| the number of repeated quantum well and barrier layers: 1 to 10 | | | |
| n-type clad layer 16 | n-GaN | Si | (4 μm) |
| AlN single crystal layer 15 | AlN | | (0.5 μm) |
| substrate 11 | sapphire (face a) | | (300 μm) |

The n-type clad layer 16 may be of a double-layered structure with an n⁻layer of low electron density on the light-emitting layer 17 side and an n⁺layer of high electron density on the undercoat layer 15 side.

The light-emitting layer 17 is not limited to the superlattice structure. A single hetero type structure, a double hetero type structure, a homo-junction type structure, or the like, may be used as the configuration of the light-emitting layer.

A group III nitride compound semiconductor layer doped with an acceptor such as magnesium and having a wide band gap may be interposed between the light-emitting layer 17 and the p-type clad layer 18. This is for preventing electrons introduced into the light-emitting layer 17 from diffusing into the p-type clad layer 18.

The p-type clad layer 18 may be of a double-layered structure with a p⁻layer of low hole density on the light-emitting layer 17 side and a p⁺layer of high hole density on the electrode side.

In the light-emitting diode configured as described above, the growth rate of the AlN single crystal layer 15 is about 50 nm (500 Å)/min. The other growth condition such as substrate temperature are in the aforementioned range.

The group III nitride compound semiconductor layers on the n-type clad layer 16 are formed by execution of an MOCVD method in a general condition.

Then, after a mask is formed, the p-type clad layer 18, the light-emitting layer (active layer) 17 and part of the n-type clad layer 16 are removed by reactive ion etching. Thus, a portion of the n-type clad layer 16 is exposed so that an n-type electrode pad 21 is formed.

After a photoresist is applied onto a semiconductor surface uniformly, the photoresist is partially removed from an electrode-forming portion on the p-type clad layer 18 by photolithography. Thus, a portion of the p-type clad layer 18 corresponding to the electrode-forming portion is exposed. The light-transmissible electrode layer 19 of Au—Co is formed on the exposed portion of the p-type clad layer 18 by an evaporation apparatus.

Then, a p-type electrode pad 20 and an n-type electrode pad 21 are vapor-deposited in the same manner as described above.

The following items will be disclosed hereunder.

(11) A laminate comprising a substrate, and an AlN single crystal layer formed on the substrate, the AlN single crystal layer having a thickness of from 0.5 to 3 μm and having a substantially flat surface, wherein the half-value width of an X-ray rocking curve of the AlN single crystal layer is not longer than 50 sec.

(12) A laminate according to the paragraph (11), wherein the AlN single crystal layer is formed by an MOCVD method.

(13) A laminate according to the paragraph (12), wherein sapphire face a heated to a temperature of from 1000 to 1200° C. is used as the substrate.

(14) A laminate according to the paragraph (12) or (13), wherein a pressure of from $4.0 \times 10^3$ to $1.3 \times 10^4$ Pa, a carrier gas flow rate of from 2 to 4 m/sec, an aluminum material gas flow rate of from $7 \times 10^{-5}$ to $4 \times 10^{-4}$ μmol/cm$^3$ and a nitrogen material gas flow rate of from 0.02 to 0.08 μmol/cm$^3$ are used when the AlN single crystal layer is grown.

(15) A laminate according to any one of the paragraphs (12) through (14), wherein the speed of growth of the AlN single crystal layer is in a range of from 20 to 60 nm/min.

(16) A laminate according to any one of the paragraphs (11) through (15), wherein a group III nitride compound semiconductor layer constituting a device function is formed on the AlN single crystal layer.

Now the present invention will be described from the another aspect.

The material of the substrate is not specifically limited so long as it is adapted to a group III nitride compound semiconductor. Examples of the substrate material which can be used may include sapphire, materials with spinel structure, silicon, silicon carbide, zinc oxide, gallium phosphide, gallium arsenide, magnesium oxide, manganese oxide, etc.

A buffer layer is generally used so that a group III nitride compound semiconductor layer good in crystallinity is formed on a sapphire substrate. $Al_xGa_{1-x}N$ ($0 \leq X \leq 1$), especially AlN, is suitably used as the material of the buffer layer.

In the present invention, a group III nitride compound semiconductor is preferably grown on a face a of the sapphire substrate.

A nitride layer is formed on a surface of the substrate. For execution of an MOCVD method, the nitride layer is formed by circulating a first gas (ammonia, hydrazine, organic amine, etc.) as a nitrogen material source of a group III nitride compound semiconductor with a hydrogen gas as a carrier gas while the temperature of the substrate is kept after heating the substrate is heated and the surface of the substrate is cleaned, under circulation of a hydrogen gas, etc. According to a first aspect of the present invention, the thickness (depth) of such a surface nitride layer is set to be in a range of from 10 to 300 Å. Although it is possible to use a surface nitride layer having a thickness larger than 300 Å, a long time is required for formation of the surface nitride layer in this case.

When, for example, a mixture gas consisting of a hydrogen gas (10 l/min) and an ammonia gas (3 l/min) is circulated for 30 minutes on the sapphire substrate heated to 1190° C., a surface nitride layer about 200 Å thick is formed. The thickness of the surface nitride layer can be controlled by adjustment of the circulation time of the mixture gas consisting of the hydrogen gas and the ammonia gas. It is further conceived that the thickness of the surface nitride layer can be controlled also by adjustment of the ammonia gas concentration and/or the substrate temperature.

According to a second aspect of the present invention, the thickness of the surface nitride layer is smaller than 10 Å. After cleaning of the surface of the substrate is completed, a nitrogen material source gas such as an ammonia gas is first circulated. Then, a group III metal element material gas such as TMA is circulated immediately after the circulation of the nitrogen material source gas is stabilized. According to the inventors' experience, the circulation of the ammonia gas is stabilized 30–90 seconds (generally, shorter than 30–60 seconds) after a valve is opened for introducing the ammonia gas. As a result, a surface nitride layer having a thickness smaller than 10 Å is formed. In this case, only the ammonia gas is supplied to the substrate surface for a short time. It is therefore conceived that the substrate surface is nitrided but it is difficult to measure the thickness of the nitrided layer.

In the second aspect of the present invention, the production step, itself, of circulating the group III metal element material gas immediately after the stabilization in the circulation of the ammonia gas is important.

Any group III nitride compound semiconductor is represented by the general formula $Al_xGa_yIn_{1-x-y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0 \leq X \leq 1$ each). The group III elements may be partially replaced by boron (B), thallium (Tl), etc. The nitrogen (N) may be partially replaced by phosphorus (P), arsenic (As), antimony (Sb), bismuth (Bi), etc. The device function portion of the light-emitting device is preferably constituted by the binary or ternary group III nitride compound semiconductor described above.

Each of the group III nitride compound semiconductors may contain any optional dopant. Si, Ge, Se, Te, C, etc. may be used as n-type impurities. Mg, Zn, Be, Ca, Sr, Ba, etc. may be used as p-type impurities. In case that it is difficult to change the group III nitride compound semiconductor to a p-type semiconductor of low resistance only by doping the group III nitride compound semiconductor with such p-type impurities, after doped with p-type impurities, the group III nitride compound semiconductor is preferably subjected to electron beam irradiation, plasma irradiation or heating by a furnace.

In the present invention, the method of forming the first group III nitride compound semiconductor layer on the substrate is a metal organic chemical vapor deposition method (in this specification, referred to as "MOCVD method"). A ternary compound $Al_xGa_{1-x}N$ ($0 \leq X \leq 1$) may be preferably used as the first group III nitride compound semiconductor. A binary compound such as AlN, GaN or InN may be also preferably used as the first group III nitride compound semiconductor.

The method of forming the second group III nitride compound semiconductor layer on the first group III nitride compound semiconductor layer is not specifically limited. In consideration of the effect of the present invention that the first group III nitride compound semiconductor layer can be grown at a high temperature by an MOCVD method, it is preferable from the point of view of improvement in production efficiency that the second group III nitride compound semiconductor layer is formed by an MOCVD method which can use a growth temperature substantially equal to the growth temperature of the first group III nitride compound semiconductor layer.

The second group III nitride compound semiconductor layer may be also formed by a known method such as a molecular beam epitaxy method (MBE method), a halide vapor phase epitaxy method (HVPE method), a liquid phase epitaxy method, etc.

The required condition for forming the first group III nitride compound semiconductor layer will be described below in detail in the first aspect of the present invention, that is, in the case of using a substrate provided with a surface nitride layer having a thickness of from 10 to 300 Å.

(Growth Temperature Condition of First Group III Nitride Compound Semiconductor Layer)

The inventors formed an AlN layer (thickness: 2.3 μm) on a face a of a sapphire substrate having a surface nitride layer 200 Å thick, by an MOCVD method while changing the growth temperature. A GaN layer (thickness: 2 μm, growth temperature: the same as the AlN layer) was further formed on the AlN layer by an MOCVD method similarly. The surface of the GaN layer was observed under an optical microscope. Observation results were as follows. FIGS. 9A to 9F show photographs of the surfaces of each sample (magnification: 400).

TABLE 1

| Sample No. | #1 | #2 | #3 | #4 | #5 | #6 |
|---|---|---|---|---|---|---|
| AlN Growth Temperature (° C.) | 1050 | 1110 | 1130 | 1150 | 1170 | 1200 |
| GaN Layer Surface Morphology | Δ | ○ | ⊚ | ○ | Δ | X | in which
⊚: mirror surface
○: almost mirror surface
Δ: not mirror surface but capable of forming the second group III nitride compound semiconductor layer thereon x: insufficient morphology to form the second group III nitride compound semiconductor layer thereon.

From the results in Table 1, the growth temperature of the AlN layer formed on the sapphire substrate by the MOCVD method is set to be preferably in a range of from 1000 to 1180° C., more preferably in a range of from 1050 to 1170° C., more and more preferably in a range of from 1100 to 1150° C., still more and more preferably in a range of from 1120 to 1140° C., most preferably 1130° C.

From the above description, the growth temperature of the group III nitride compound semiconductor layer formed on the substrate by the MOCVD method is set to be preferably in a range of from 1000 to 1180° C., more preferably in a range of from 1050 to 1170° C., more and more preferably in a range of from 1100 to 1150° C., still more and more preferably in a range of from 1120 to 1140° C., most preferably 1130° C.

(Thickness Condition of First Group III Nitride Compound Semiconductor Layer)

The inventors formed an AlN layer (growth temperature: 1130° C.) on a face a of a sapphire substrate having a surface nitride layer 200 Å thick, by an MOCVD method while changing the thickness of the AlN layer. A GaN layer (thickness: 2 μm, growth temperature: the same as the AlN layer) was further formed on the AlN layer by an MOCVD method similarly. The surface of the GaN layer was observed under an optical microscope. Observation results were as follows. FIGS. 6A to 6F show photographs of the surfaces of each sample (magnification: 400).

TABLE 2

| Sample No. | #7 | #8 | #9 | #10 | #11 | #12 |
|---|---|---|---|---|---|---|
| AlN Thickness (μm) | 0.8 | 1.0 | 1.5 | 2.3 | 3.0 | 3.3 |
| GaN Layer Surface Morphology | X | X | ○ | ⊚ | ○ | X | in which
⊚: mirror surface
○: almost mirror surface
Δ: not mirror surface but capable of forming the second group III nitride compound semiconductor layer thereon x: insufficient morphology to form the second group III nitride compound semiconductor layer thereon.

From the results in Table 2, the thickness of the AlN layer formed on the sapphire substrate at a growth temperature of 1130° C. by the MOCVD method is set to be preferably in a range of from 1.2 to 3.2 μm, more preferably in a range of from 1.5 to 3.0 μm, more and more preferably in a range of from 2.0 to 2.7 μm, most preferably 2.3 μm.

From the above description, the thickness of the group III nitride compound semiconductor layer formed on the substrate by the MOCVD method under the same growth temperature condition as the first group III nitride compound semiconductor layer is set to be preferably in a range of from 1.2 to 3.2 μm, more preferably in a range of from 1.5 to 3.0 μm, more and more preferably in a range of from 2.0 to 2.7 μm, most preferably 2.3 μm.

(Growth Rate Condition of First Group III Nitride Compound Semiconductor Layer)

From the point of view of mass production, at least 10 nm/min is required as the growth rate of the group III nitride compound semiconductor layer in order to form the group III nitride compound semiconductor layer having a thickness of not smaller than 1 μm. On the other hand, even in the case where the flow rate of the group III element material gas is increased so that the growth rate is improved, the growth rate of the group III nitride compound semiconductor layer does not increase monotonously so that the material utilizing efficiency is lowered. From the point of view of cost, therefore, the upper limit of the growth rate of the group III nitride compound semiconductor layer is set to be 250 nm/min.

(Pressure Condition of First Group III Nitride Compound Semiconductor Layer)

TMA which is a group III element material gas has high reactivity. Hence, if TMA is oversupplied into a chamber of an MOCVD apparatus, TMA reacts with an ammonia gas, etc. in the vapor phase (carrier gas) so as to hardly reach the substrate. Hence, the growth rate of the first group III nitride compound semiconductor layer is hardly increased by increase of the flow rate of TMA. To suppress the reaction in the vapor phase, therefore, the first group III nitride compound semiconductor layer was grown under reduced pressure. As a result, it became possible to form the second group III nitride compound semiconductor layer good in morphology.

According to the inventors' examination, the relation between the maximum growth rate of the AlN layer and the inside pressure of the chamber in the case where the MOCVD method was executed on a face a of a sapphire substrate having a surface nitride layer 200 Å thick was as follows.

TABLE 3

| Pressure at Reaction | Optimal Growth Rate |
|---|---|
| 2500 Pa (18.8 Torr) | 250 nm/min |
| 20000 Pa (150 Torr) | 100 nm/min |
| 40000 Pa (300 Torr) | 42 nm/min |
| 101080 Pa (760 Torr) | 0.6 nm/min |

In other words, the optimal growth rate of the AlN layer is in a range surrounded by the aforementioned values when the pressure at the reaction and the growth rate are regarded as parameters.

From the above description, the pressure at the reaction is set to be preferably in a range of from 2500 to 4000 Pa in order to obtain a significant growth rate.

The relation between the pressure at the reaction and the growth rate applies also to any other group III nitride compound semiconductor than AlN.

The required condition for the first group III nitride compound semiconductor layer will be described below in the second aspect of the present invention, that is, in the case of using a substrate provided with a surface nitride layer having a thickness of from 0 to 10 Å.

Incidentally, the growth temperature condition, the growth rate condition and the growth pressure condition are the same as in the first aspect of the present invention.

(Thickness Condition of First Group III Nitride Compound Semiconductor Layer)

In the second aspect of the present invention, the required thickness condition for the first group III nitride compound semiconductor layer is different (relatively thin) formed that in the first aspect.

After the face a of the sapphire substrate was cleaned, an ammonia gas was introduced into a hydrogen gas as a carrier gas while the substrate temperature was kept at 1130° C. After about 1 minute (because the state of circulation of the ammonia gas was stabilized), TMA was further introduced so that an AlN layer different in thickness was grown by an MOCVD method. A GaN layer (thickness: 2 µm, growth temperature: the same as the AlN layer) was further formed on the AlN layer by an MOCVD method similarly. The surface of the GaN layer was observed under an optical microscope. Observation Results were as follows. FIGS. 7A to 7F show photographs of the surfaces of each sample (magnification: 400).

TABLE 4

| Sample No. | #13 | #14 | #15 | #16 | #17 | #18 |
|---|---|---|---|---|---|---|
| AlN Thickness (µm) | 0.015 | 0.30 | 0.45 | 0.90 | 1.90 | 2.30 |

TABLE 4-continued

| Sample No. | #13 | #14 | #15 | #16 | #17 | #18 |
|---|---|---|---|---|---|---|
| GaN Layer Surface Morphology | ◯ | ⊙ | ⊙ | ◯ | Δ | Δ | in which
⊙: mirror surface
◯: almost mirror surface
Δ: not mirror surface but capable of forming the second group III nitride compound semiconductor layer thereon
x: insufficient morphology to form the second group III nitride compound semiconductor layer thereon.

From the results in Table 4, the thickness of the AlN layer formed, by the MOCVD method, on the sapphire substrate provided with the surface nitride layer having a thickness of from 0 to 10 Å is set to be preferably in a range of from 0.01 to 2.3 µm at a growth temperature of 1130° C. If the thickness of the AlN layer is smaller than 0.01 µm, there is a disadvantage that the morphology of the GaN layer grown on the AlN layer is worsened. The thickness of the AlN layer is set to be more preferably in a range of from 0.1 to 1.5 µm, more and more preferably in a range of from 0.2 to 0.5 µm, most preferably about 0.45 µm.

From the above description, the thickness of the group III nitride compound semiconductor layer formed on the substrate by the MOCVD method in the aforementioned growth temperature condition of the first group III nitride compound semiconductor layer is set to be preferably in a range of from 0.01 to 2.3 µm, more preferably in a range of from 0.1 to 1.5 µm, more and more preferably in a range of from 0.2 to 0.5 µm, most preferably about 0.45 µm.

An embodiment of the present invention will be described below.

Figure 8:
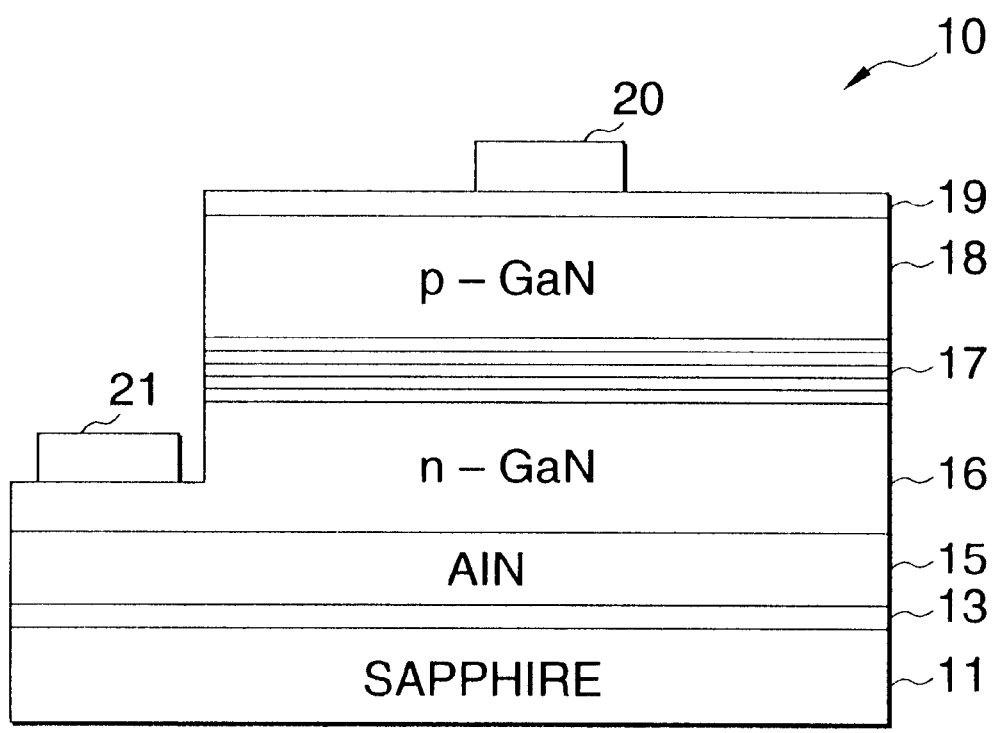
FIG. 8 shows a light-emitting diode as another embodiment of the present invention.
Figure 9A:
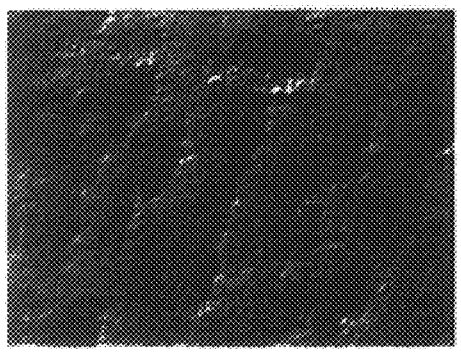
FIGS. 9A to 9F show photographs of the surfaces of each sample in table 1.
Figure 9B:
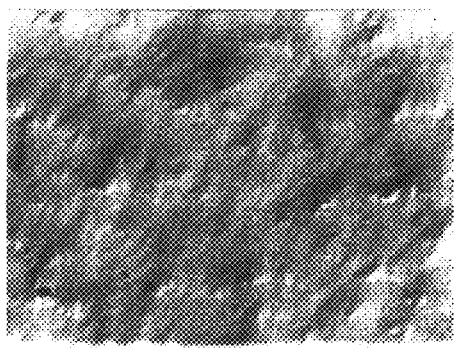
Figure 9C:
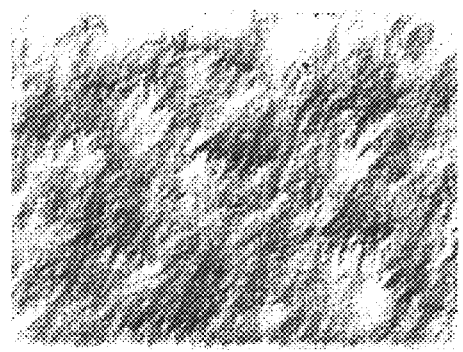
Figure 9D:
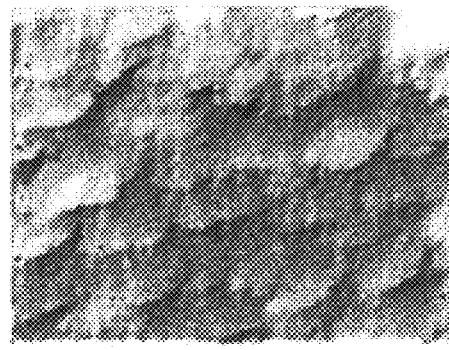
Figure 9E:
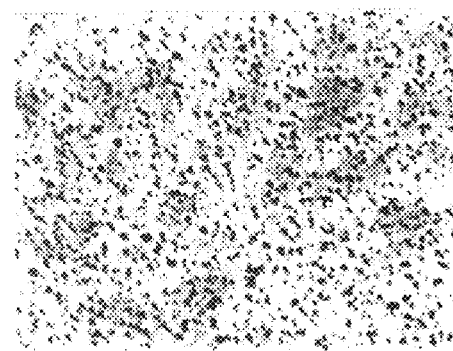
Figure 9F:
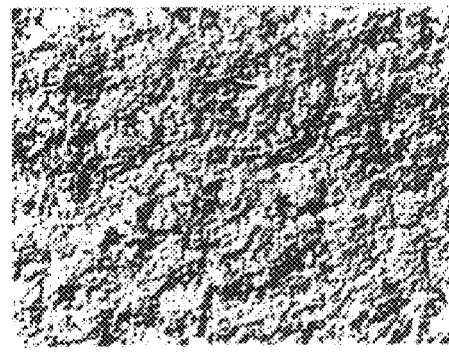

A light-emitting diode 10 is used as this embodiment. The configuration of the light-emitting diode 10 is shown in FIG. 8.

Specifications of respective layers are as follows.

| Layer | Composition | Dopant | (Thickness) |
|---|---|---|---|
| p-type layer 18 | p-GaN | Mg | (0.3 µm) |
| Light-emitting layer 17 | superlattice structure | | |
| Quantum well layer | $In_{0.15}Ga_{0.85}N$ | | (35Å) |
| Barrier layer | GaN | | (35Å) |
| The number of repeated quantum well and barrier layers: 1 to 10 | | | |
| n-type layer 16 | n-GaN | Si | (4 µm) |
| Buffer layer 15 | AlN | | (2.3 µm) |
| Substrate 11 | sapphire (face a) | | (300 µm) |

The n-type layer 16 may be of a double-layered structure with an $n^-$ layer of low electron density on the light-emitting layer 17 side and an $n^+$ layer of high electron density on the buffer layer 15 side.

The light-emitting layer 17 is not limited to that which has such a superlattice structure. A single hetero type structure, a double hetero type structure, a homo-junction type structure, or the like, may be used as the configuration of the light-emitting layer. The light-emitting layer may be configured also by use of any other function such as MIS junction or PIN junction.

An $Al_xIn_yGa_{1-x-y}N$ (inclusive of X=0, Y=0 and X=Y=0) layer doped with an acceptor such as magnesium and having a wide band gap may be interposed between the light-emitting layer 17 and the p-type layer 18. This is a technique for preventing electrons introduced into the light-emitting layer 17 from diffusing into the p-type layer 18.

The p-type layer 18 may be of a double-layered structure with a p⁻layer of low hole density on the light-emitting layer 17 side and a p⁺layer of high hole density on the electrode side.

Each of the n-type and p-type layers may be of the aforementioned double-layered structure (clad layer, contact layer), and at the same time may be of a superlattice structure to improve the function of the layer.

The light-emitting diode configured as described above is produced as follows.

First, while a hydrogen gas is circulated into a reactor of an MOCVD apparatus, the sapphire substrate is heated to 1000° C. and kept at 1000° C. for 5 minutes. Then, the substrate 11 is heated to 1130° C. and only an ammonia gas is introduced first as a material gas for 15 minutes. Thus, a surface nitride layer 13 100 Å thick (deep) is formed.

Then, while the substrate temperature of 1130° C. is held, TMA is introduced so that a buffer layer 15 of AlN is grown by an MOCVD method. While the substrate temperature is further held, an n-type layer 16 is formed, and second group III nitride compound semiconductor layers 17 and 18 are formed on the n-type layer 16 by an ordinary method (MOCVD method). In the growth method, an ammonia gas and group III element alkyl compound gases such as trimethylgallium (TMG), trimethylaluminum (TMA) and trimethylindium (TMI) are supplied onto a substrate heated to a suitable temperature and are subjected to a thermal decomposition reaction so that a desired crystal is grown on the substrate.

The second group III nitride compound semiconductor layer thus formed in this embodiment is superior both in morphology and in crystallinity.

A light-transmissible electrode 19 is a thin film containing gold. The light-transmissible electrode 19 is laminated on the p-type layer 18 so as to cover the substantial whole upper surface of the p-type layer 18. A p-type electrode 20 is also constituted by a material containing gold. The p-type electrode 20 is formed on the light-transmissible electrode 19 by evaporation.

An n-type electrode 21 is formed by evaporation onto a surface of the n-GaN layer 16 exposed by etching.

The device to which the present invention is applied is not limited to the aforementioned light-emitting diode. The present invention may be applied also to optical devices such as a photodetector, a laser diode, a solar cell, etc., bipolar devices such as a rectifier, a thyristor, a transistor, etc., unipolar devices such as an FET, etc., and electronic devices such as a microwave device, etc.

The present invention may be applied further to laminates as intermediates of these devices.

The present invention is not limited to the mode for carrying out the invention and the embodiment thereof at all, and includes various modifications that can be conceived easily by those skilled in the art, without departing from the scope of claim.

The following items will be disclosed hereunder.

(21) A method for producing a group III nitride compound semiconductor device, comprising the steps of:
keeping a sapphire substrate at a temperature of from 1000 to 1180° C.;
forming a surface nitride layer having a thickness of not larger than 300 Å on a surface of the substrate by circulating a first gas as a nitrogen material source of a group III nitride compound semiconductor onto the substrate; and forming a group III nitride compound semiconductor layer having a thickness of from 0.01 to 3.2 $\mu$m by circulating a second gas as a group III element material source of the group III nitride compound semiconductor together with the first gas.

(22) A producing method according to the paragraph (21), wherein the thickness of the surface nitride layer is in a range of from 10 to 300 Å whereas the thickness of the group III nitride compound semiconductor layer is in a range of from 1.2 to 3.2 $\mu$m.

(23) A producing method according to the paragraph (21), wherein the thickness of the surface nitride layer is smaller than 10 Å whereas the thickness of the group III nitride compound semiconductor layer is in a range of from 0.01 to 2.3 $\mu$m.

(24) A producing method according to any one of claims 1 through 14 and the paragraphs (21) through (23), wherein the growth temperature is in a range of from 1050 to 1180° C.

(25) A producing method according to any one of claims 1 through 14 and the paragraphs (21) through (23), wherein the growth temperature is in a range of from 1110 to 1150° C.

(26) A producing method according to any one of claims 2 and 11 and the paragraph (22), wherein the thickness is in a range of from 1.5 to 3.0 $\mu$m.

(27) A producing method according to any one of claims 2 and 11 and the paragraph (22), wherein the thickness is in a range of from 2.0 to 2.7 $\mu$m.

(28) A producing method according to any one of claims 3 and 12 and the paragraph (23), wherein the thickness is in a range of from 0.01 to 1.7 $\mu$m.

(29) A producing method according to any one of claims 3 and 12 and the paragraph (23), wherein the thickness is in a range of from 0.3 to 1.0 $\mu$m.

(31) A group III nitride compound semiconductor device, comprising a group III nitride compound semiconductor layer having a thickness of from 0.01 to 3.2 $\mu$m formed, on a substrate having a surface nitride layer having a thickness of not larger than 300 Å, at a growth temperature of from 1000 to 1180° C.

(32) A device according to the paragraph (31), wherein the thickness of the surface nitride layer is in a range of from 10 to 300 Å whereas the thickness of the group III nitride compound semiconductor layer is in a range of from 1.2 to 3.2 $\mu$m.

(33) A device according to the paragraph (31), wherein the thickness of the surface nitride layer is smaller than 10 Å whereas the thickness of the group III nitride compound semiconductor layer is in a range of from 0.01 to 2.3 $\mu$m.

(34) A device according to any one of the paragraphs (31) through (33), wherein the growth rate of the group III nitride compound semiconductor layer is in a range of from 10 to 250 nm/min.

(35) A device according to any one of the paragraphs (31) through (33), wherein pressure at the time of growth of the group III nitride compound semiconductor layer is in a range of from 2500 to 40000 Pa.

(36) A device according to any one of the paragraphs (31) through (35), wherein the group III nitride compound semiconductor layer is made of $Al_xGa_{1-x}N$ ($0 \leq X \leq 1$).

(37) A device according to the paragraph (36), wherein the group III nitride compound semiconductor layer is made of AlN.

(38) A device according to the paragraph (37), wherein a GaN layer is formed on the AlN layer.

(39) A device according to any one of the paragraphs (31) through (38), wherein the substrate is sapphire.

(40) A device according to the paragraph (39), wherein the group III nitride compound semiconductor layer is formed on a face a of the sapphire substrate.

(41) A group III nitride compound semiconductor device comprising a first group III nitride compound semiconductor layer having a thickness of from 0.01 to 3.2 μm and formed on a sapphire substrate having a surface nitride layer having a thickness of not larger than 300 Å, and a second group III nitride compound semiconductor layer formed on the first group III nitride compound semiconductor layer, wherein each of the first and second group III nitride compound semiconductor layers is formed at a growth temperature substantially equal to or higher than the growth temperature of the second group III nitride compound semiconductor layer by an MOCVD method.

(42) A device according to the paragraph (41), wherein the thickness of the surface nitride layer is in a range of from 10 to 300 Å whereas the thickness of the group III nitride compound semiconductor layer is in a range of from 1.2 to 3.2 μm.

(43) A device according to the paragraph (41), wherein the thickness of the surface nitride layer is smaller than 10 Å whereas the thickness of the group III nitride compound semiconductor layer is in a range of from 0.01 to 2.3 μm.

(44) A group III nitride compound semiconductor device comprising a sapphire substrate nitrided for a time of from 30 to 90 sec, and a group III nitride compound semiconductor layer formed on the nitrided sapphire substrate at a temperature of from 1000 to 1180° C.

(45) A device according to the paragraph (44), wherein the time required for the nitriding is not shorter than 30 sec but shorter than 60 sec.

(51) A group III nitride compound semiconductor device obtained through the steps of:
  keeping a sapphire substrate at a temperature of from 1000 to 1180° C.;
  forming a surface nitride layer having a thickness of not larger than 300 Å on a surface of the substrate by circulating a first gas as a nitrogen material source of a group III nitride compound semiconductor onto the substrate; and
  forming a group III nitride compound semiconductor layer having a thickness of from 0.01 to 3.2 μm by circulating a second gas as a group III element material source of the group III nitride compound semiconductor together with the first gas.

(52) A device according to the paragraph (51), wherein the thickness of the surface nitride layer is in a range of from 10 to 300 Å whereas the thickness of the group III nitride compound semiconductor layer is in a range of from 1.2 to 3.2 μm.

(53) A device according to the paragraph (51), wherein the thickness of the surface nitride layer is smaller than 10 Å whereas the thickness of the group III nitride compound semiconductor layer is in a range of from 0.01 to 2.3 μm.

(54) A device according to any one of the paragraphs (31) through (53), wherein the growth temperature is in a range of from 1050 to 1180° C.

(55) A device according to any one of the paragraphs (31) through (53), wherein the growth temperature is in a range of from 1110 to 1150° C.

(56) A device according to any one of the paragraphs (32), (41) and (52), wherein the thickness is in a range of from 1.5 to 3.0 μm.

(57) A device according to any one of the paragraphs (32), (41) and (52), wherein the thickness is in a range of from 2.0 to 2.7 μm.

(58) A device according to any one of the paragraphs (33), (42) and (53), wherein the thickness is in a range of from 0.01 to 1.7 μm.

(59) A device according to any one of the paragraphs (33), (42) and (53), wherein the thickness is in a range of from 0.3 to 1.0 μm.

(61) A method for producing a laminate comprising the step of growing, at a growth temperature of from 1000 to 1180° C., a layer of a group III nitride compound semiconductor having a thickness of from 0.01 to 3.2 μm on a substrate having a surface nitride layer having a thickness of not larger than 300 Å.

(62) A producing method according to the paragraph (61), wherein the thickness of the surface nitride layer is in a range of from 10 to 300 Å whereas the thickness of the group III nitride compound semiconductor layer is in a range of from 1.2 to 3.2 μm.

(63) A producing method according to the paragraph (61), wherein the thickness of the surface nitride layer is smaller than 10 Å whereas the thickness of the group III nitride compound semiconductor layer is in a range of from 0.01 to 2.3 μm.

(64) A producing method according to any one of the paragraphs (61) through (63), wherein the growth rate of the group III nitride compound semiconductor layer is in a range of from 10 to 250 nm/min.

(65) A producing method according to any one of the paragraphs (61) through (63), wherein pressure at the time of growth of the group III nitride compound semiconductor layer is in a range of from 2500 to 40000 Pa.

(66) A producing method according to any one of the paragraphs (61) through (65), wherein the group III nitride compound semiconductor layer is made of $Al_xGa_{1-x}N$ ($0 \leq X \leq 1$).

(67) A producing method according to the paragraph (66), wherein the group III nitride compound semiconductor layer is made of AlN.

(68) A producing method according to any one of the paragraphs (61) through (67), wherein the substrate is sapphire.

(69) A producing method according to the paragraph (68), wherein the group III nitride compound semiconductor layer is formed on a face a of the sapphire substrate.

(70) A method for producing a laminate, comprising the steps of: forming a first group III nitride compound semiconductor layer having a thickness of from 0.01 to 3.2 μm on a sapphire substrate having a surface nitride layer having a thickness of not larger than 300 Å; and forming a second group III nitride compound semiconductor layer on the first group III nitride compound semiconductor layer, wherein each of the first and second group III nitride compound semiconductor layers is formed at a growth temperature substantially equal to or higher than the growth temperature of the second group III nitride compound semiconductor layer by an MOCVD method.

(71) A producing method according to the paragraph (70), wherein the thickness of the surface nitride layer is in a range of from 10 to 300 Å whereas the thickness of the group III nitride compound semiconductor layer is in a range of from 1.2 to 3.2 µm.

(72) A producing method according to the paragraph (70), wherein the thickness of the surface nitride layer is smaller than 10 Å whereas the thickness of the group III nitride compound semiconductor layer is in a range of from 0.01 to 2.3 µm.

(73) A method for producing a laminate, comprising the steps of: nitriding a sapphire substrate for a time of from 30 to 90 sec; and growing a group III nitride compound semiconductor layer on the nitrided sapphire substrate at a temperature of from 1000 to 1180° C.

(74) A producing method according to the paragraph (73), wherein the time required for the nitriding is not shorter than 30 sec but shorter than 60 sec.

(81) A method for producing a laminate, comprising the steps of:
keeping a sapphire substrate at a temperature of from 1000 to 1180° C.;
forming a surface nitride layer having a thickness of not larger than 300 Å on a surface of the substrate by circulating a first gas as a nitrogen material source of a group III nitride compound semiconductor onto the substrate; and
forming a group III nitride compound semiconductor layer having a thickness of from 0.01 to 3.2 µm by circulating a second gas as a group III element material source of the group III nitride compound semiconductor together with the first gas.

(82) A producing method according to the paragraph (81), wherein the thickness of the surface nitride layer is in a range of from 10 to 300 Å whereas the thickness of the group III nitride compound semiconductor layer is in a range of from 1.2 to 3.2 µm.

(83) A producing method according to the paragraph (81), wherein the thickness of the surface nitride layer is smaller than 10 Å whereas the thickness of the group III nitride compound semiconductor layer is in a range of from 0.01 to 2.3 µm.

(84) A producing method according to any one of the paragraphs (61) through (83), wherein the growth temperature is in a range of from 1050 to 1180° C.

(85) A producing method according to any one the paragraphs (61) through (83), wherein the growth temperature is in a range of from 1110 to 1150° C.

(86) A producing method according to any one the paragraph (62), (71) and (82), wherein the thickness is in a range of from 1.5 to 3.0 µm.

(87) A producing method according to any one of the paragraphs (62), (71) and (82), wherein the thickness is in a range of from 2.0 to 2.7 µm.

(88) A producing method according to any one of the paragraphs (63), (72) and (83), wherein the thickness is in a range of from 0.01 to 1.7 µm.

(89) A producing method according to any one of the paragraphs (63), (72) and (83), wherein the thickness is in a range of from 0.3 to 1.0 µm.

(91) A laminate comprising a group III nitride compound semiconductor layer having a thickness of from 0.01 to 3.2 µm formed, on a substrate having a surface nitride layer having a thickness of not larger than 300 Å, at a growth temperature of from 1000 to 1180° C.

(92) A laminate according to the paragraph (91), wherein the thickness of the surface nitride layer is in a range of from 10 to 300 Å whereas the thickness of the group III nitride compound semiconductor layer is in a range of from 1.2 to 3.2 µm.

(93) A laminate according to the paragraph (91), wherein the thickness of the surface nitride layer is smaller than 10 Å whereas the thickness of the group III nitride compound semiconductor layer is in a range of from 0.01 to 2.3 µm.

(94) A laminate according to any one of the paragraphs (91) through (93), wherein the growth rate of the group III nitride compound semiconductor layer is in a range of from 10 to 250 nm/min.

(95) A laminate according to any one of the paragraphs (91) through (93), wherein pressure at the time of growth of the group III nitride compound semiconductor layer is in a range of from 2500 to 40000 Pa.

(96) A laminate according to any one of the paragraphs (91) through (95), wherein the group III nitride compound semiconductor layer is made of $Al_xGa_{1-x}N$ ($0 \leq X \leq 1$).

(97) A laminate according to the paragraph (96), wherein the group III nitride compound semiconductor layer is made of AlN.

(98) A laminate according to the paragraph (97), wherein a GaN layer is formed on the AlN layer.

(99) A laminate according to any one of the paragraphs (91) through (97), wherein the substrate is sapphire.

(100) A laminate according to the paragraph (99), wherein the group III nitride compound semiconductor layer is formed on a face a of the sapphire substrate.

(101) A laminate comprising a first group III nitride compound semiconductor layer having a thickness of from 0.01 to 3.2 µm and formed on a sapphire substrate having a surface nitride layer having a thickness of not larger than 300 Å, and a second group III nitride compound semiconductor layer formed on the first group III nitride compound semiconductor layer, wherein each of the first and second group III nitride compound semiconductor layers is formed at a growth temperature substantially equal to or higher than the growth temperature of the second group III nitride compound semiconductor layer by an MOCVD method.

(102) A laminate according to the paragraph (101), wherein the thickness of the surface nitride layer is in a range of from 10 to 300 Å whereas the thickness of the group III nitride compound semiconductor layer is in a range of from 1.2 to 3.2 µm.

(103) A laminate according to the paragraph (101), wherein the thickness of the surface nitride layer is smaller than 10 Å whereas the thickness of the group III nitride compound semiconductor layer is in a range of from 0.01 to 2.3 µm.

(104) A laminate comprising a sapphire substrate nitrided for a time of from 30 to 90 sec, and a group III nitride compound semiconductor layer formed on the nitrided sapphire substrate at a temperature of from 1000 to 1180° C.

(105) A laminate according to the paragraph (104), wherein the time required for the nitriding is not shorter than 30 sec but shorter than 60 sec.

(111) A group III nitride compound semiconductor laminate obtained through the steps of:

keeping a sapphire substrate at a temperature of from 1000 to 1180° C.;

forming a surface nitride layer having a thickness of not larger than 300 Å on a surface of the substrate by circulating a first gas as a nitrogen material source of a group III nitride compound semiconductor onto the substrate; and forming a group III nitride compound semiconductor layer having a thickness of from 0.01 to 3.2 μm by circulating a second gas as a group III element material source of the group III nitride compound semiconductor together with the first gas.

(112) A laminate according to the paragraph (111), wherein the thickness of the surface nitride layer is in a range of from 10 to 300 Å whereas the thickness of the group III nitride compound semiconductor layer is in a range of from 1.2 to 3.2 μm.

(113) A laminate according to the paragraph (111), wherein the thickness of the surface nitride layer is smaller than 10 Å whereas the thickness of the group III nitride compound semiconductor layer is in a range of from 0.01 to 2.3 μm.

(114) A laminate according to any one of the paragraphs (91) through (113), wherein the growth temperature is in a range of from 1050 to 1180° C.

(115) A laminate according to any one of the paragraphs (91) through (113), wherein the growth temperature is in a range of from 1110 to 1150° C.

(116) A laminate according to any one of the paragraphs (92), (101) and (112), wherein the thickness is in a range of from 1.5 to 3.0 μm.

(117) A laminate according to any one of the paragraphs (92), (101) and (112), wherein the thickness is in a range of from 2.0 to 2.7 μm.

(118) A laminate according to any one of the paragraphs (93), (102) and (113), wherein the thickness is in a range of from 0.01 to 1.7 μm.

(119) A laminate according to any one of the paragraphs (93), (102) and (113), wherein the thickness is in a range of from 0.3 to 1.0 μm.

What is claimed is:

1. A group III nitride compound semiconductor light emitting device, comprising:

a substrate; and an AlN single crystal layer formed on said substrate, said AlN single crystal layer having a thickness of from 0.5 to 3 μm and having a substantially flat surface, wherein a half-value width of an X-ray rocking curve of said AlN single crystal layer is not longer than 50 sec.

2. A light emitting device according to claim 1, wherein said AlN single crystal layer is formed by a metal organic chemical vapor deposition.

3. A light emitting device according to claim 2, wherein sapphire face heated to a temperature of from 1000 to 1200° C. is used as said substrate.

4. A light emitting device according to claim 2, wherein a pressure of from $4.0 \times 10^3$ to $1.3 \times 10^4$ Pa, a carrier gas flow rate of from 2 to 4 m/sec, an aluminum material gas flow rate of from $7 \times 10^{-5}$ to $4 \times 10^{-4}$ μmol/cm$^3$ and a nitrogen material gas flow rate of from 0.02 to 0.08 μmol/cm$^3$ are used when said AlN single crystal layer is grown.

5. A light emitting device according to claim 2, wherein a growth speed of said AlN single crystal layer is in a range of from 20 to 60 nm/min.

6. A light emitting device according to claim 1, wherein a group III nitride compound semiconductor layer constituting a device function is formed on said AlN single crystal layer.

* * * * *